United States Patent [19]

Neal et al.

[11] Patent Number: 5,228,132

[45] Date of Patent: Jul. 13, 1993

[54] MEMORY MODULE ARRANGED FOR DATA AND PARITY BITS

[75] Inventors: Joseph H. Neal, Missouri City; Kenneth A. Poteet, Houston, both of Tex.

[73] Assignee: Texas Instrument Incorporated, Dallas, Tex.

[21] Appl. No.: 800,773

[22] Filed: Nov. 27, 1991

Related U.S. Application Data

[63] Continuation of Ser. No. 415,074, Sep. 29, 1989, Pat. No. 5,089,993.

[51] Int. Cl.⁵ .................. G06F 13/00; G06F 11/10; G06F 1/04; G11C 7/00
[52] U.S. Cl. ..................... 395/425; 395/550; 365/193; 365/230.03; 365/233; 365/238.5; 371/49.1
[58] Field of Search ............ 365/230.03, 52, 63, 365/193, 230.01, 238.5, 233; 371/50.1, 51.1, 49.1; 395/425, 550

[56] References Cited

U.S. PATENT DOCUMENTS

| | | | |
|---|---|---|---|
| 4,081,701 | 3/1978 | White, Jr. et al. | 365/203 |
| 4,371,963 | 2/1983 | Edwards, Jr. et al. | 371/50.1 |
| 4,375,665 | 3/1983 | Schmidt | 365/63 |
| 4,453,251 | 6/1984 | Osman | 371/51.1 |
| 4,583,204 | 4/1986 | Takemae et al. | 365/226 |
| 4,636,986 | 1/1987 | Pinkham | 365/230.03 |
| 4,656,605 | 4/1987 | Clayton | 365/230.03 |
| 4,658,377 | 4/1987 | McElroy | 365/230.03 |
| 4,679,196 | 7/1987 | Tsujimoto | 371/51.1 |
| 4,797,850 | 1/1989 | Amitai | 365/193 |
| 4,875,190 | 10/1989 | Sakano | 365/230.03 |

FOREIGN PATENT DOCUMENTS 55-88154 7/1980 Japan.

OTHER PUBLICATIONS

MOS Memory, Texas Instruments Incorporated (1988), pp. 4-119 to 4-150—TMS44C256 and TMS44C257; pp. 4-79 to 4-118—TMS44C251; and pp. 5-31 to 5-3-9—TM024EAD9 Texas Instruments Incorporated Data Sheet TMS44C260.

Primary Examiner—Glenn Gossage
Attorney, Agent, or Firm—Richard B. Havill; Leo N. Heiting; Richard L. Donaldson

[57] ABSTRACT

A semiconductor memory architecture, which includes a given number of discrete components, provides a memory module of increased capacity. The memory module includes a plurality of discrete data memory circuits each organized to provide an individual data string having a length that is an integer multiple of four bits. Each memory circuit has a different separate data lead. A row address strobe signal is applied to the memory circuits. A different column address strobe signal is applied to pairs of the memory circuits. Another discrete memory device includes plural dynamic cell arrays, each of the dynamic cell arrays having a terminal for receiving a row address strobe and a different separate data lead. Each of the dynamic cell arrays has a terminal for receiving a different column address strobe signal.

2 Claims, 12 Drawing Sheets

| PIN NOMENCLATURE | |
|---|---|
| A0-A8 | ADDRESS INPUTS |
| $\overline{CAS0}$-$\overline{CAS9}$ | COLUMN-ADDRESS STROBE |
| DQ0-DQ31 | DATA IN/DATA OUT |
| MP0-MP3 | PARITY |
| NC | NO CONNECTION |
| PD0-PD3 | PRESENCE DETECTS |
| $\overline{RAS0}$-$\overline{RAS3}$ | ROW ADDRESS STROBE |
| Vcc | 5-V SUPPLY |
| Vss | GROUND |
| $\overline{W}$ | WRITE ENABLE |
| X | UNDETERMINED PIN |

MEMORY MODULE ARRANGED FOR DATA AND PARITY BITS

This is a continuation, of application Ser. No. 07/415,074, filed Sep. 29, 1989, now U.S. Pat. No. 5,089,993.

FIELD OF THE INVENTION

This invention relates to semiconductor memory devices and, more particularly, it relates to a memory circuit having multiple, independently controllable data paths as well as a memory module formed with such a circuit.

BACKGROUND OF THE INVENTION

Progressively larger capacity semiconductor memories of all types are being fabricated as higher bit densities and smaller cell designs are realized. In 1972 efforts were being made to produce 4 kilobit (4 Kbit) Dynamic Random Access Memories (DRAMs) and by 1983 256 Kbit devices became available. One megabit (1 Mbit) DRAM devices were introduced by 1987, 4 Mbit devices will be sold widely by 1990 and 16 Mbit devices are currently in design stages. Memory devices with 64 Mbit, 256 Mbit or even larger capacities may be manufactured during the 1990's.

Despite rapid increases in the capacities of DRAMs, Static Random Access Memories (SRAMs) and nonvolatile memory devices, there continues to be a need to form microprocessor based systems with larger memory capacities than available in a single device. Memory modules provide a standard solution to the problem of meeting ever-increasing memory capacity requirements. Generally, a memory module comprises plural discrete memory devices mounted on a common substrate. For example, a 256 Kbit memory module can be configured with four 64 Kbit DRAMs to form a 64K×4 memory, i.e., a composite memory with four I/O paths for storing 64K four bit words. Similarly, ×8 modules handle eight bit words while ×9 modules accommodate a parity bit as well as eight data bits.

Memory modules of much higher capacity can be formed with 256 Kbit and 1 Mbit devices. By way of example, DRAM module TM024EAD9, manufactured by Texas Instruments Incorporated, incorporates nine 1 Mbit DRAMs to provide a 1,048,576×9 memory organization in a 30-pin Single-In-Line Package (SIP). In this memory module, the Column Address Strobe (CAS) control lines on eight of the devices are connected in common to the same control pin to provide eight parallel data lines for ×8 operation. A separate CAS control line is provided for the ninth device, which stores the parity bit.

In many memory applications, it is important to assure data accuracy by performing a parity check for each word of data. Thus it is common for module designs to include additional memory circuitry to store parity information. Module architectures can be formed to accommodate parity data for larger word sizes, e.g., 16, 32 or 64 bit data I/O. An example is DRAM module TM256KBC36, also manufactured by Texas Instruments Incorporated, which comprises eight 1 Mbit DRAMs and four 256 Kbit DRAMs to provide a ×36 organization. The storage depth of this module, i.e., the number of words which can be stored on the module, is 256K. In addition to providing a 36 bit word length with a 256K depth, this architecture provides an even greater depth for shorter words. That is, the TM256KBC36 is a ×36 module capable of storing either 262,144 36-bit words, 524,288 18-bit words or 1,048,576 9-bit words.

The TM256KBC36, schematically illustrated in FIG. 1, is configured as a single-in-line package with four groups of memory devices. Each group includes two 256K×4 DRAMs and one 256K×1 DRAM. Each group provides 256K of storage depth for eight bits of data and a parity bit. The CAS control lines of all devices in the same group are wired to a common group control pin. Thus each of four group control pins is associated with a different 9-bit data group stored in three of the 12 module devices. This enables read/write operations in integer multiples of 9-bit words.

Although modules such as the TM256KBC36 provide a convenient and flexible means for expanding memory capacity, it is well known that the advantages of such are accompanied by an increased cost per bit of memory over the cost per bit of a discrete device. A portion of these increased costs is inherent to the formation of a complex circuit with multiple integrated circuit devices. The cost of packaging and testing a module also increases in proportion to the number of discrete components on the board. In addition, significant costs are associated with development and fabrication of memory boards which accommodate a large number of integrated circuits. In particular, designs which minimize thermal stress and mechanical vibration problems become more costly as the weight, physical size and power requirements of a module increase. Surface mount technology, which reduces module size and fabrication costs, has provided only a partial solution to some of these problems.

In view of these factors and a growing demand for progressively larger capacity memory systems, there is a desire in the art to further reduce the physical size and cost per bit of memory modules.

SUMMARY OF THE INVENTION

Accordingly, the invention provides an architecture by which a given number of discrete components can provide a memory module of increased capacity. It is an object of the invention to reduce the number of discrete memory circuit components which are required to store a given size word. It is another object of the invention to reduce the board level costs of packaging and testing a memory module.

In one form of the invention, a memory module includes a plurality of discrete data memory circuits each organized to provide an individual data string having a length that is an integer multiple of four bits. The data memory circuits are arranged to provide a combined data string having a length equal to the sum of the individual data string lengths. Each data memory circuit includes a signal line connected to control transfer of individual data strings. A different data pin is associated with each bit of the combined data string to transfer a datum for output from the module. Each signal line is connected to a control pin to receive an external signal for initiating transfer of one of the individual strings from one of the data memory circuits.

The module comprises an additional memory circuit which includes a plurality of additional signal lines and a plurality of additional data lines. A first of the additional signal lines is wired in common with the signal line of a first one of the data memory circuits and a second of the additional memory signal lines is wired in common with the signal line of a second one of the data memory circuits. The additional circuit is responsive to transfer a bit of data along one of the additional data lines when an individual data string is transferred from one of the data memory circuits.

In a preferred embodiment of the invention, the additional memory circuit provides four or more bits of parity data. Each bit of parity data is associated with an eight bit string of data provided by one or more of the data memory circuits.

BRIEF DESCRIPTION OF THE DRAWING

The invention may best be understood by reference to the following detailed description when read in conjunction with the accompanying drawing, wherein.

DETAILED DESCRIPTION OF THE PREFERRED EMBODIMENT

Dynamic random access memory arrays are generally described in U.S. Pat. No. 4,081,701, issued to White, et al. and assigned to Texas Instruments Incorporated. High density monolithic semiconductor memory devices constructed with multiple arrays formed thereon are well known in the art. See, for example, Pinkham U.S. Pat. No. 4,636,986, also assigned to Texas Instruments Incorporated and incorporated herein by reference, which illustrates a dual port, i.e., both random and serial access, memory device such as provided for video RAM applications. Normally, each of the multiple arrays comprises an equal number of active memory elements arranged in rows and columns. Strings of address data are provided to common row and column decoders of the multiple arrays to simultaneously access a memory cell in each array. Separate input/output buffers are associated with each array for parallel transfer of data, either stored or to be stored in the arrays, to and from an external source.

It has been proposed that the input to individual arrays on such a device can be controlled to selectively write data to less than all the memory cells having a common address. To this extent, the Pinkham U.S. Pat. No. 4,636,986 discloses a write mask circuit for inhibiting data transfer to addressed memory locations and also teaches formation of a bit mapped video display memory device wherein writing of data into each of several arrays on the device is controllable with a separate Column Address Strobe signal $\overline{CAS}$.

In the past the concept of restricting data input to less than all memory cells having a common address has been largely, if not solely, applied to dual port memory designed into graphic display systems because unique advantages are manifest when writing graphics data or providing enhanced graphics capabilities. Moreover, while devices which include the write mask feature have become commercially popular, it is not known that video RAM designs which incorporate multiple Column Address Strobe control lines have generated any significant commercial interest. Perhaps this is because an additional Column Address Strobe signal $\overline{CAS}$ pin would be required to control each separate array.

According to the invention, it is recognized that a separate Column Address Strobe signal $\overline{CAS}$ for each of several arrays on a memory device provides advantages beyond that of restricting data input to less than all memory cells having a common address.

Figure 2:
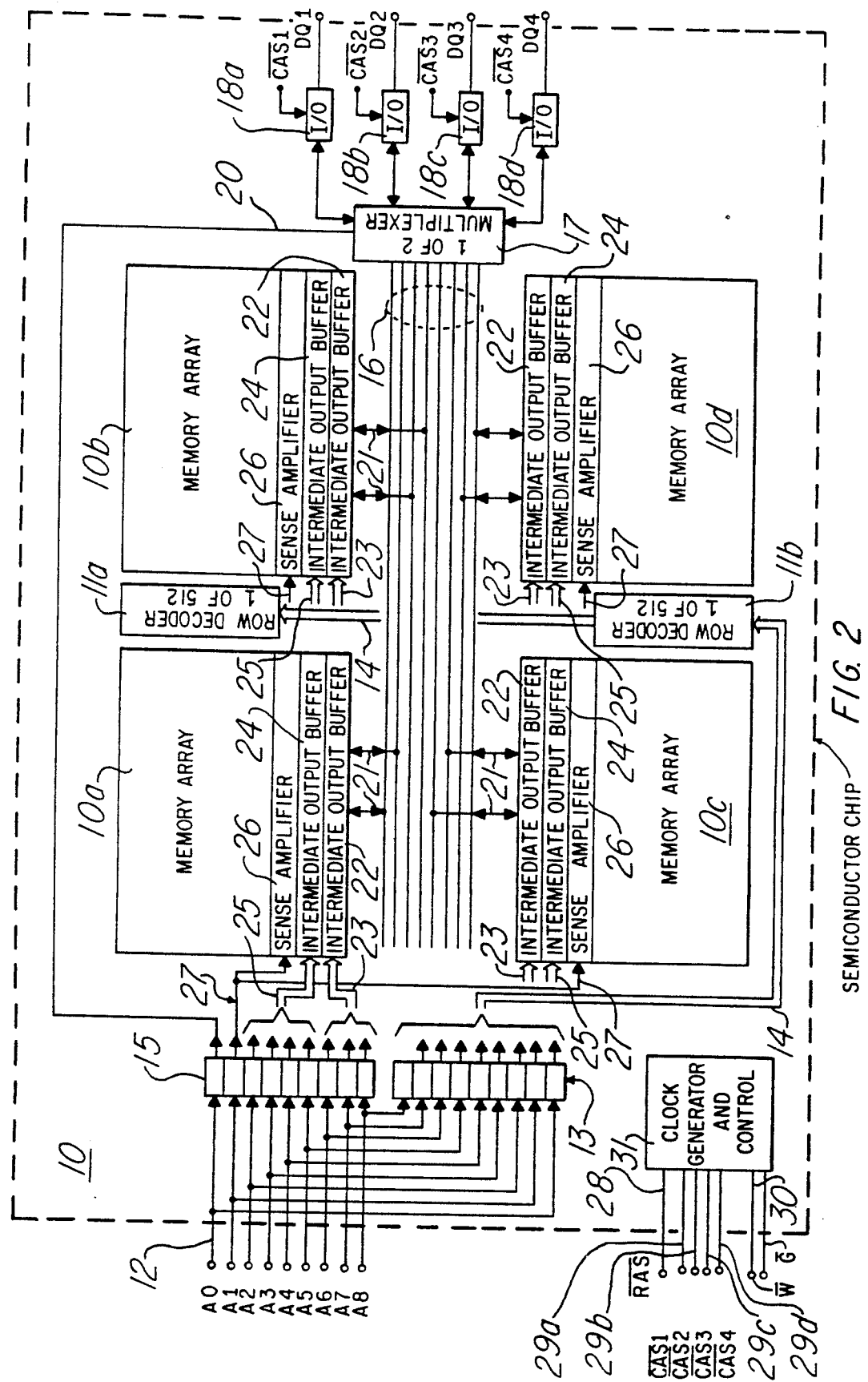
FIG. 2 illustrates a semiconductor memory device which, according to the invention, includes multiple Column Address Strobe control line inputs.

Referring to FIG. 2, there is illustrated one example of a semiconductor memory device 10 comprising four memory arrays blocks. The device 10 is of the so-called 1 Mbit size, having $2^{20}$ or 1,048,576 memory cells distributed into the four arrays 10a, 10b, 10c and 10d with each array containing 262,144 cells. For each array there are 512 row lines. All of the row lines are connected to one of two row decoders 11a or 11b. Each row decoder receives a nine-bit row address from address input pins 12 by way of row address latches 13 and lines 14. A nine-bit column address is also applied to the input pins 12, in time multiplexed manner, for input to buffers 15. Eight data Input/Output (I/O) lines 16, are positioned in the center of the array. Four of these eight lines 16 are simultaneously selected for data input or output by a 1-of-2 multiplexer 17. Output signals from the multiplexer 17 are sent via four I/O lines through buffers 18a, 18b, 18c and 18d to data I/O pins DQ1, DQ2, DQ3 and DQ4. For selection controls, the multiplexer 17 receives one bit of column address data transmitted along line 20 from one of the column address buffers 15.

Two of the eight I/O lines 16 are connected to each of the memory array blocks by I/O lines 21. A 2-of-16 column selection is made in each of sixteen sets of sixteen intermediate output buffers 24 in each array block, using four bits of the column address on lines 25 from the buffers 15. For each of the arrays 10a, 10b, 10c and 10d, there are 512 sense amplifiers 26, each connected to an array. Each column comprises a pair of bit lines, each of which is selectively coupled to a number of bit line segments, as more fully described in U.S. Pat. No. 4,658,377, assigned to the assignee of the present invention and incorporated herein by reference. Each of the buffers 24 is coupled for selection between one of two columns based on one bit of column address information received from the buffers 15 on line 27.

The arrays 10a, 10b, 10c and 10d could, of course, be further partitioned for power reduction and noise reduction purposes, e.g., into four sub-arrays with additional decoding. The number of data I/O lines 16 could also be increased, and it is contemplated that the lines 16 will be increased to at least 16 data lines with a 1-of-4 multiplexer (in lieu of the multiplexer 17) receiving two address bits and providing four bit data I/O.

The memory device 10 receives a Row Address Strobe signal ($\overline{RAS}$) on input pin 28 and multiple Column Address Strobe signals $\overline{CAS1}$, e,ovs/CAS/ 2, $\overline{CAS3}$, and $\overline{CAS4}$ on pins 29a, 29b, 29c and 29d, respectively. Each of the output buffers 18a, 18b, 18c and 18d is enabled, respectively, by a Column Address Strobe signal $\overline{CAS1}$, $\overline{CAS2}$, $\overline{CAS3}$ or $\overline{CAS4}$ to transfer data to or from an associated data I/O pin DQ. Selection of a read or write operation is controlled by a read/write control signal $\overline{W}$ which is input to pin 30. A clock generator and control circuit 31 produces all of the internal clocks and control signals as needed for the various random access operations.

Figure 3:
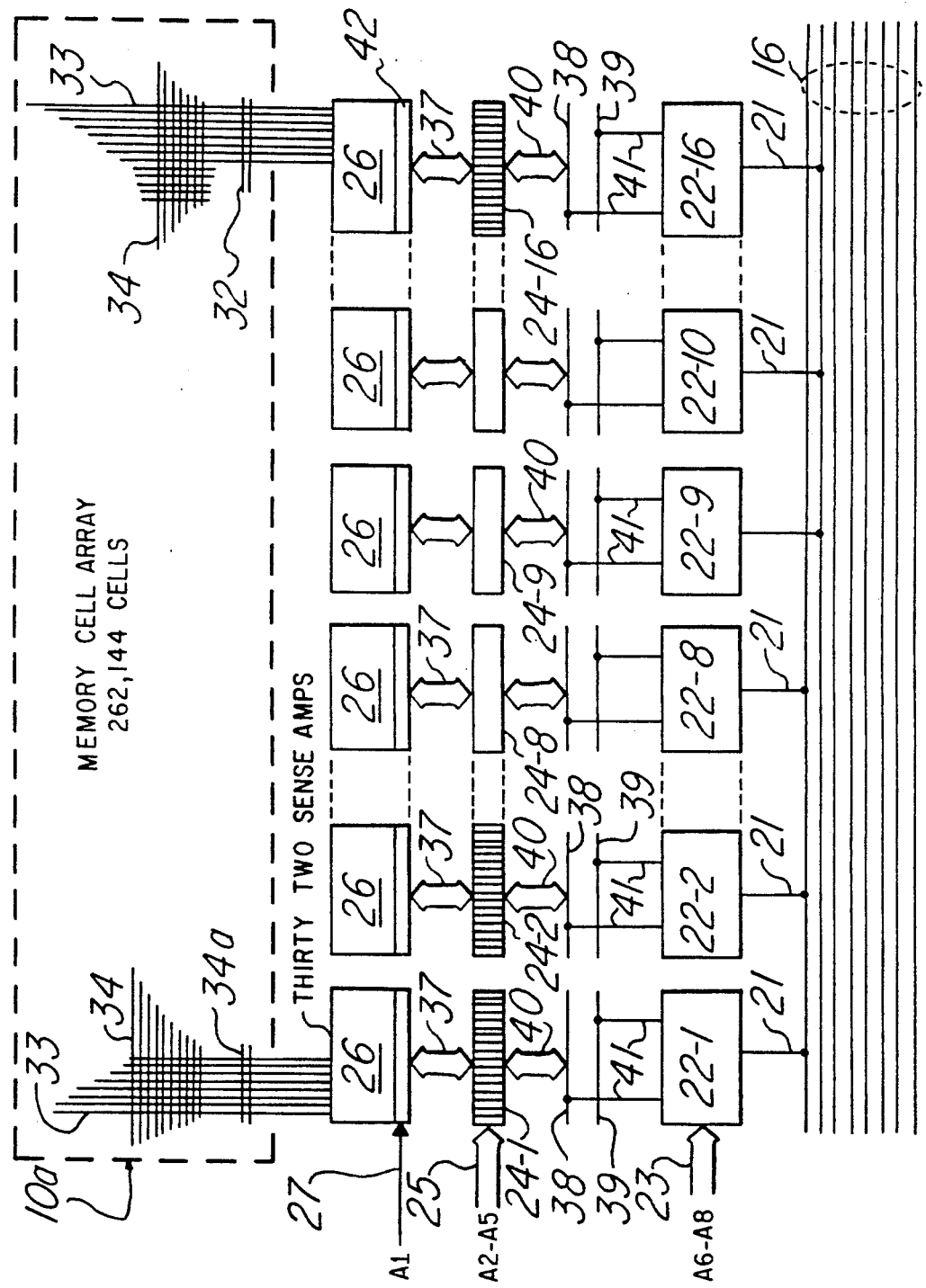
FIG. 3 illustrates details of the FIG. 2 device.

FIG. 3 illustrates in greater detail the I/O lines 16, the first and second level intermediate output buffers 22 and 24, and the sense amplifiers 26 for a block containing one of the arrays 10a, 10b, 10c and 10d. Sixteen intermediate output buffers 22 are arranged in groups of eight (22-1 ... 22-8 and 22-9 ... 22-16). Each group of eight buffers 22 is connected by a line 21 to one of two lines 16.

Associated with each of the buffers 22-1 through 22-16 there is a set of sixteen buffers 24. Each set of buffers 24-1 through 24-16 is coupled to a group of 32 sense amplifiers 26 that are arranged in pairs.

The memory array 10a includes 512 row lines 34 which intersect both the bit lines 33 and two rows of dummy cells 34a that are each coupled to the bit lines in the usual manner and are selectable by one of the row decoders 11a or 11b of FIG. 2, according to one bit of the nine-bit row address. Each sense amplifier 26 of FIG. 3 is connected to a pair of bit lines 33 which, in turn, is selectively coupled to bit line segments, as described in U.S. Pat. No. 4,658,377. One bit of the column address from the buffers 15 of FIG. 2 is transmitted along line 27 of FIGS. 2 and 3 to selectively connect one of two sense amplifiers 26 in each of the sixteen pairs (in a set of sense amplifiers) to one of the sixteen buffers 24 via lines 37.

Figure 4:
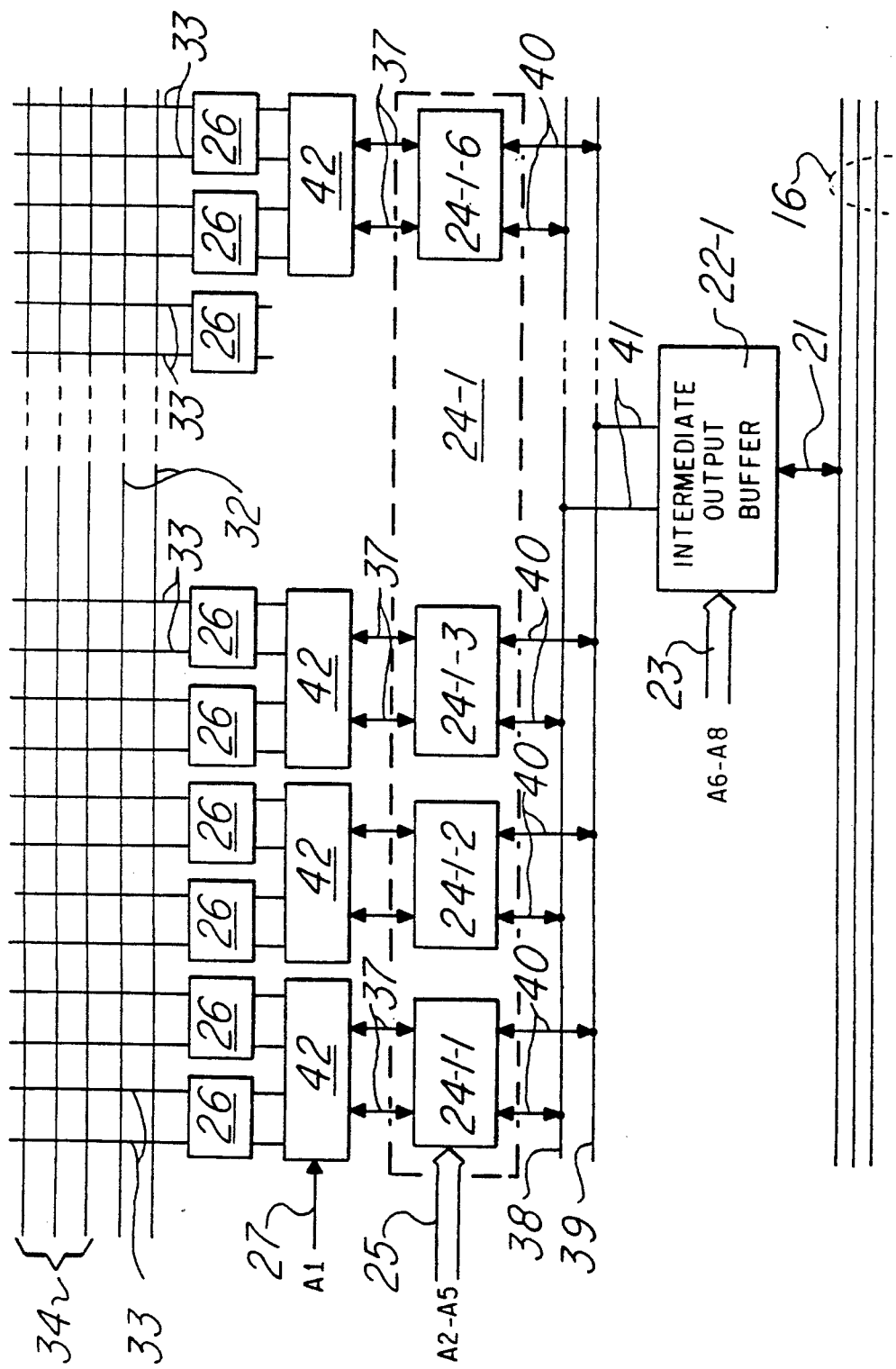
FIG. 4 illustrates details of the FIG. 2 device.

FIG. 4 presents a portion of the FIG. 3 circuitry to illustrate in greater detail the relationships between the set of sense amplifiers 26 associated with the set of sixteen buffers 24-1. Each sense amplifier 26 has two bit lines 33 extending therefrom in the well known folded bit line configuration. The row lines 34 intersect the bit lines 33. The memory cells are located at intersections of the row and bit line segments. A multiplexer 42 (for each pair of sense amplifiers 26) selects one sense amplifier 26, based on the value of a column address bit transmitted along the line 27, for connection to the relevant buffer 24. Based on four column address bits transmitted over the lines 25, only one of the sixteen buffers, such as the buffer 24-1, is selected at any one time for coupling to the lines 38 and 39. Selection of the buffer 22-1, illustrated in FIG. 4, is controlled by a 2-of-16 selection made by three bits of data on lines 23. Selection of the buffer 22-1 couples the dual-rail I/O lines 38 and 39 to one of the two single rail I/O lines 16 associated with the memory array 10a.

With reference again to FIG. 2 and as described above, each of the memory arrays 10a, 10b, 10c and 10d shares a common row decoder and a common column decoder. A row address and an associated Row Address Strobe signal ($\overline{RAS}$) activate the addressed row in each of the arrays 10a, 10b, 10c, and 10d. Each of the Column Address Strobe signals $\overline{CAS1}$, $\overline{CAS2}$, $\overline{CAS3}$ and $\overline{CAS4}$ selectively activates an addressed column in a corresponding array 10a, 10b, 10c or 10d. Absent this feature, the sharing of a common column decoder among all four arrays would require reading or writing of data to all of the arrays 10a, 10b, 10c and 10d, simultaneously. By providing a separate Column Address Strobe control signal for each of the arrays 10a, 10b, 10c and 10d, it becomes possible to selectively transfer data between any one of the pins DQ1, DQ2, DQ3, or DQ4 and a corresponding one of the arrays 10a, 10b, 10c or 10d. This separate I/O operation allows the device 10 to operate in a parity mode, as more fully described below.

Figure 5:
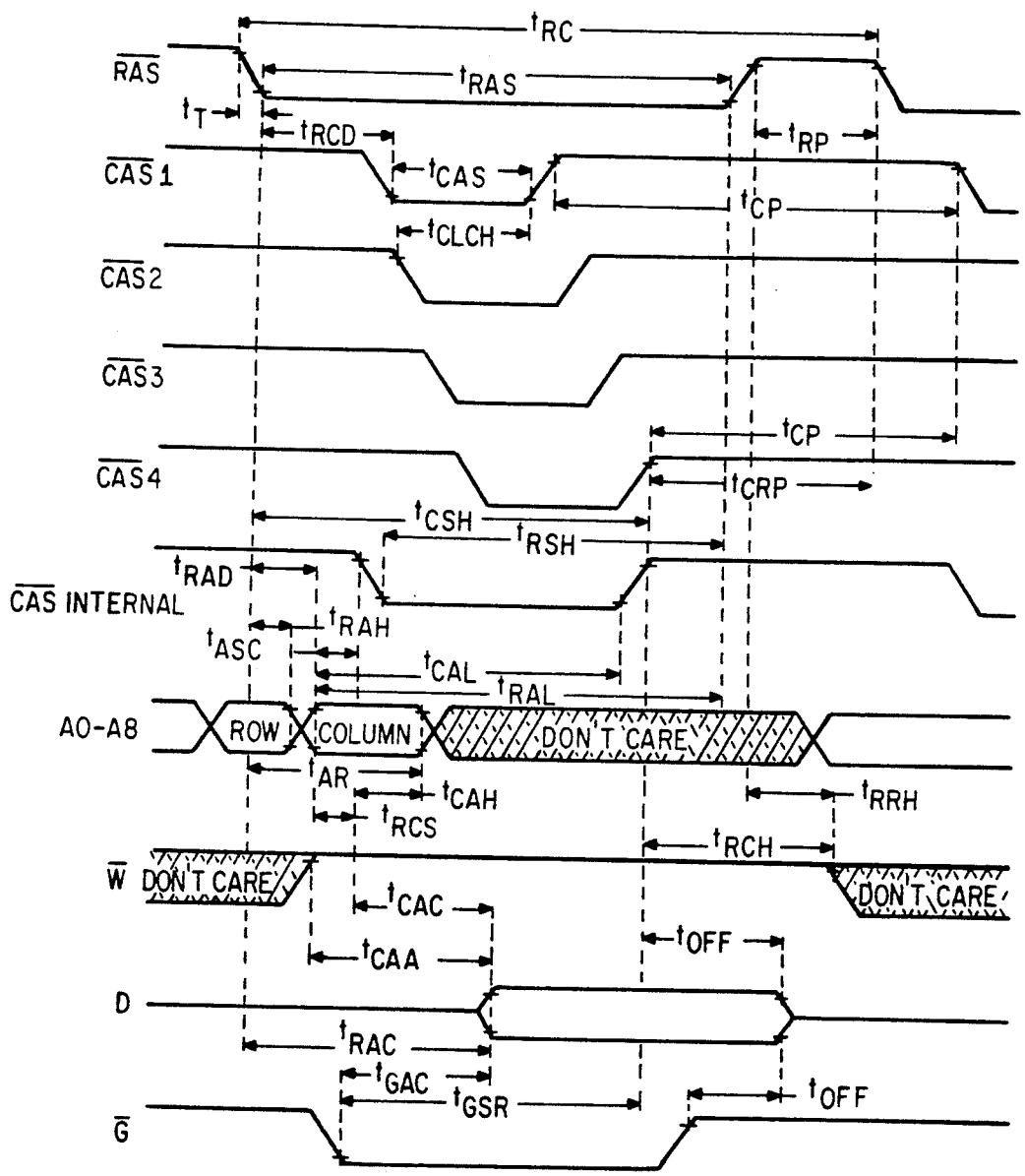
FIGS. 5-9 are timing diagrams which illustrate relationships between control signals and data I/O during various modes of operation for the device of FIG. 2.
Figure 5A:
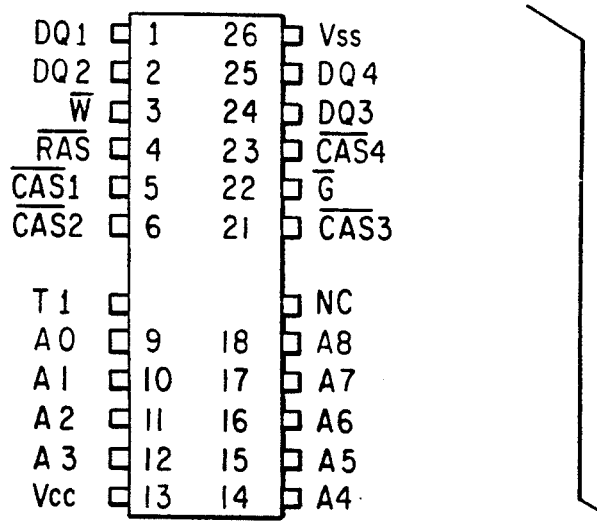
FIG. 5A is a legend table for FIG. 5.
Figure 6:
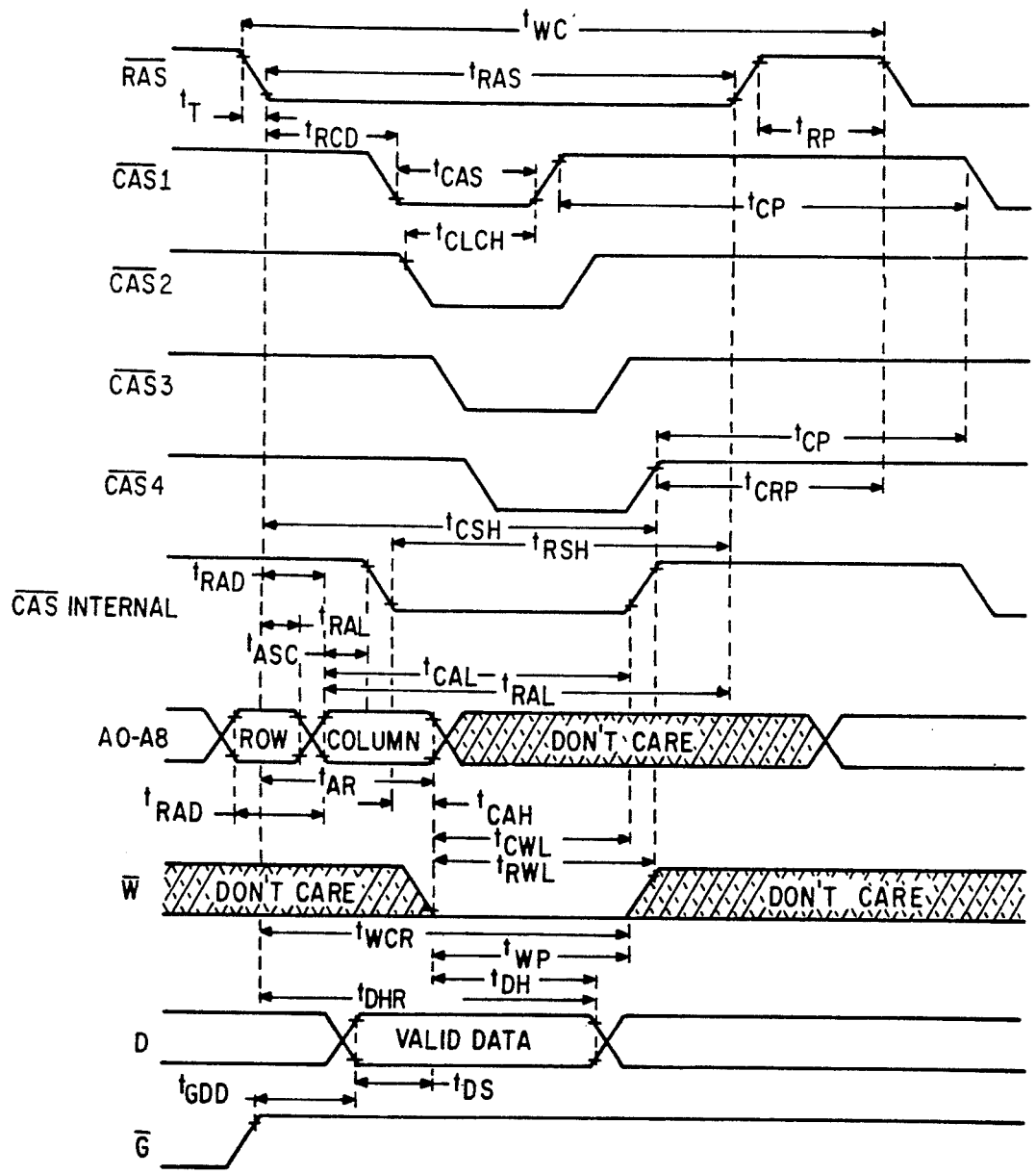
Figure 7:
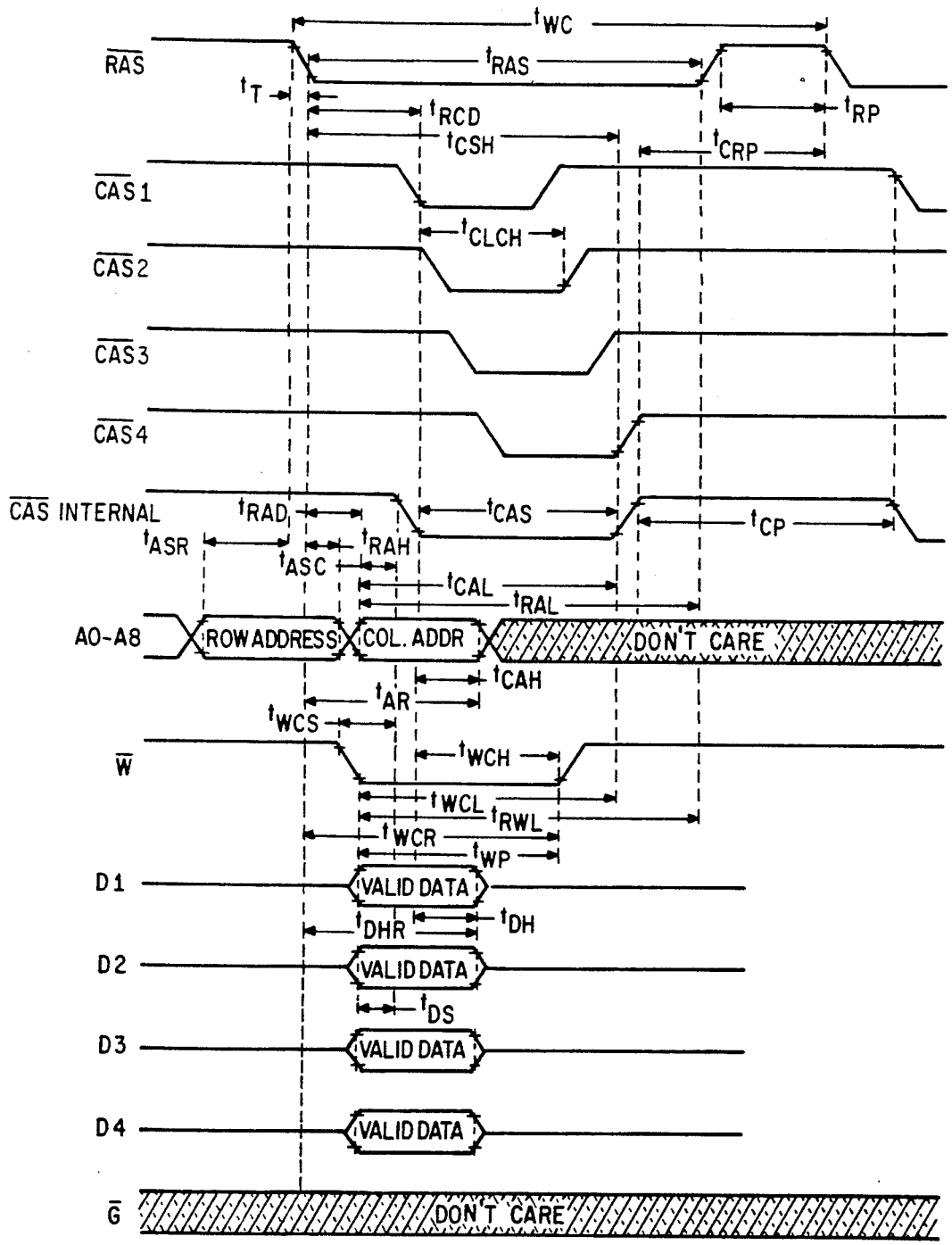
Figure 8:
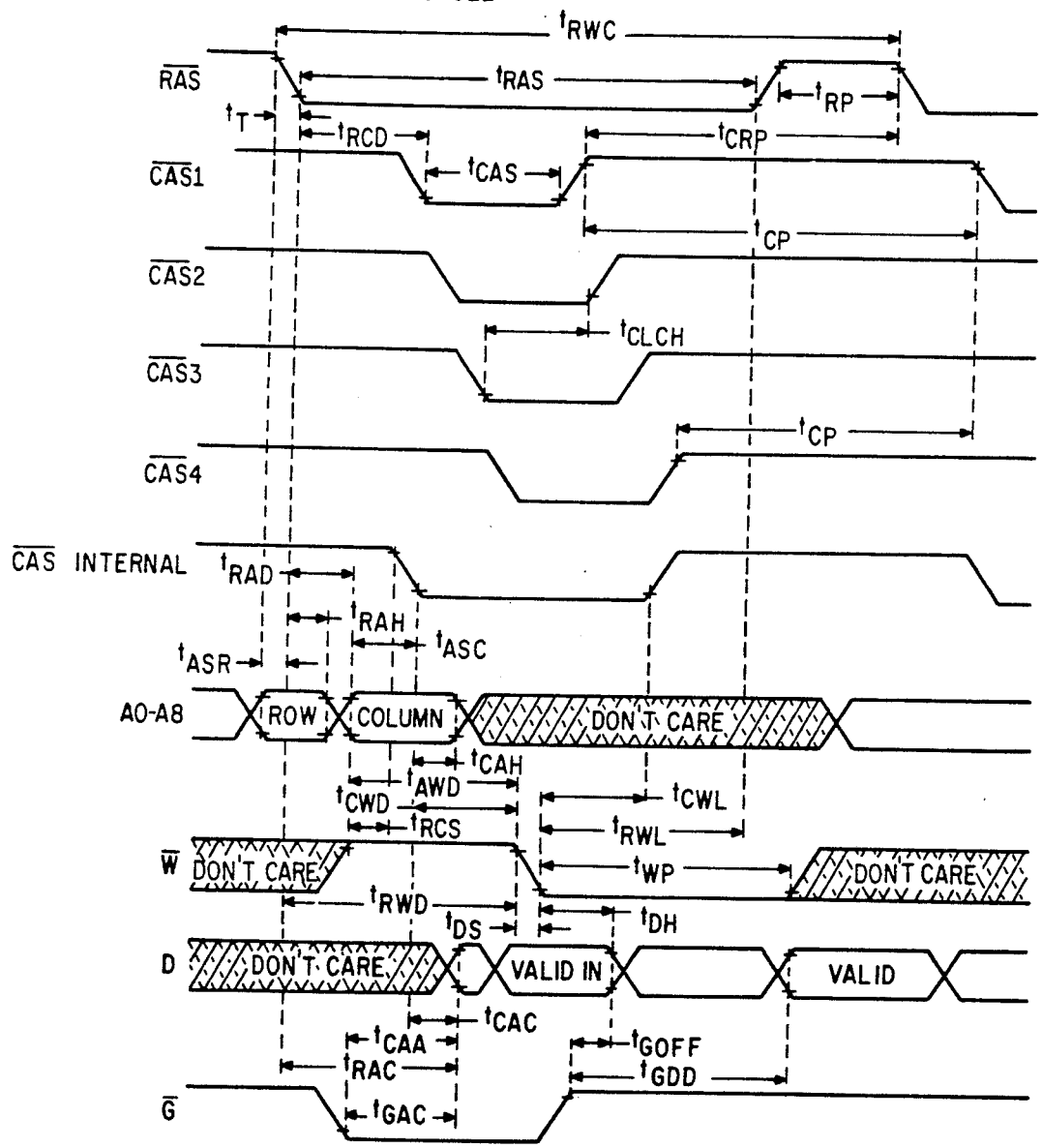
Figure 9:
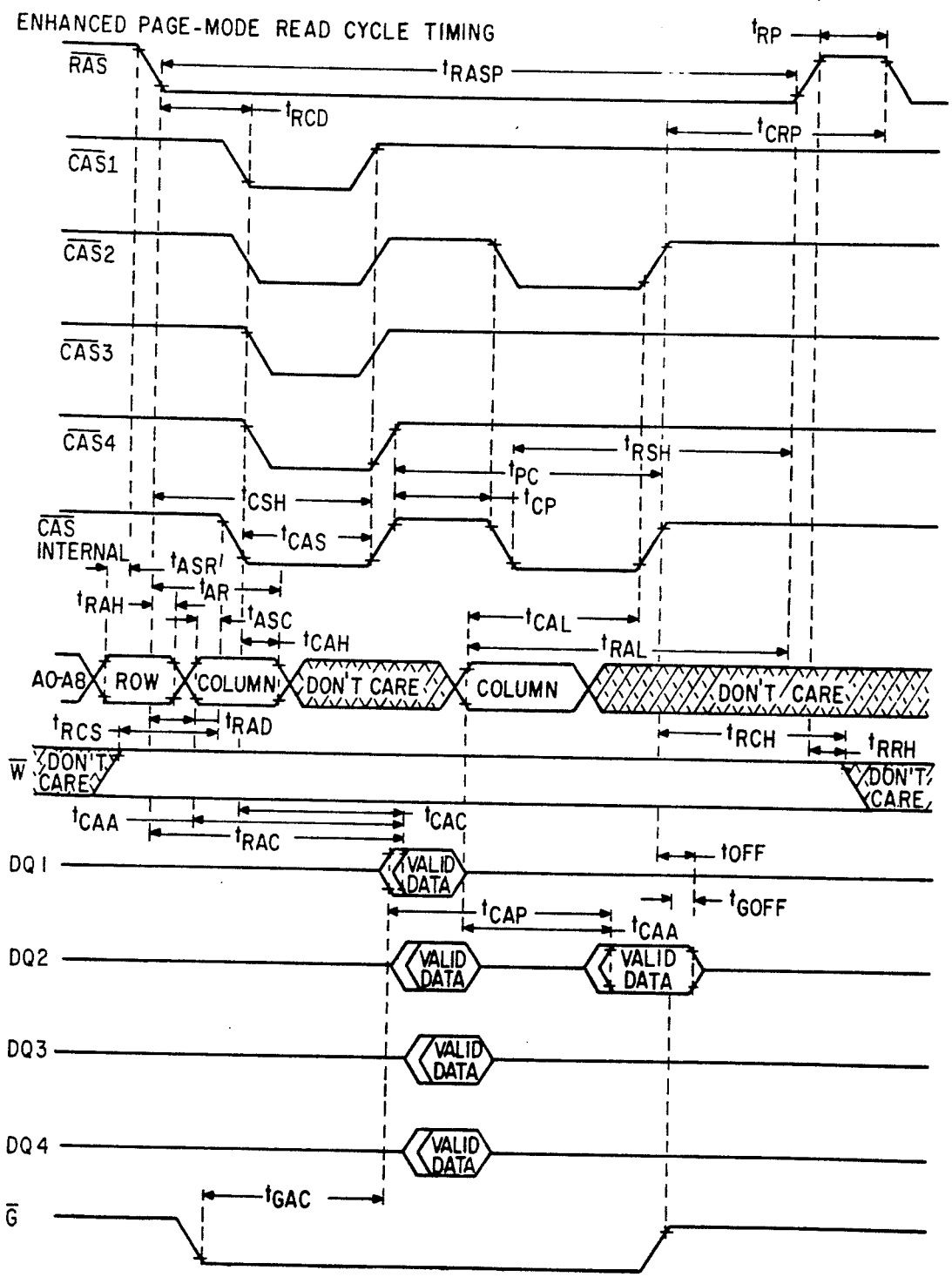

FIGS. 5-9 illustrate timing relationships, respectively, for the following operations: read; write; early write; read-write/read-modify-write; and page mode. These operations are now summarily discussed in conjunction with transfer of parity data although the device 10 may provide other functions wherein signals on the four independent CAS input pins 29a-29d provide independent control of the four data I/O pins DQ1-DQ4. Associated pin nomenclature is defined in the legend of FIG. 5A. Further detail relating to this exemplary embodiment may be acquired from Advance Information Data Sheets for Part No. TMS44C260 available from Texas Instruments Incorporated, Post Office Box 1443, Houston, Tex. 77001, incorporated herein by reference.

For read or write cycles, the column address is latched on the falling edge of the first Column Address Strobe signal, on any of the pins 29, changing from a logic high state to a logic low state. In addition, each time a Column Address Strobe signal goes low, the corresponding pin DQ is enabled to transmit data, corresponding to the latched address, to or from one of the memory arrays 10a-10d. All address set up and hold parameters are referenced to the first falling edge of the signals $\overline{CAS}$. The delay time, i.e., from the falling edge of a signal $\overline{CAS}$ to the time when "valid data" becomes available, is measured from the falling edge of a particular signal $\overline{CAS}$ to the time when data appears at the corresponding pin DQ.

In order to latch a new column address, all of the Column Address Strobe pins 30 first must be brought to a logic high level. The column precharge time, parameter $T_{cp}$, is measured from the last signal $\overline{CAS}$ which undergoes a transition high to the falling edge of the first signal $\overline{CAS}$ in the next cycle. For early write cycles, data is latched on the first falling edge of a signal $\overline{CAS}$. However, only the pins DQ which correspond to a logic low signal $\overline{CAS}$ will transmit data to memory.

Page mode operation allows for faster access times by retaining one row address while applying a series of column addresses and control signals $\overline{CAS}$. This eliminates the time required for row-address setup and hold times which would otherwise occur in a time-multiplexed fashion. Unlike conventional page-mode operations, the column address buffers 15 in the device 10 of FIG. 2 are activated on the falling edge of the signal $\overline{RAS}$. When the signal $\overline{RAS}$ goes low, the clock generator and control circuit 31 supplies a signal to power up the column address buffers 15. The column address buffers 15 act as "transparent", or flow-through latches, while all of the signals $\overline{CAS}$ are in a logic high state. This feature permits the device 10 to operate at a higher data bandwidth than conventional page-mode parts. That is, data retrieval begins as soon as the column address becomes valid rather than when a corresponding signal $\overline{CAS}$ transitions low. The valid column address can be presented immediately after the row address hold time, $t_{RAH}$, has been satisfied.

Eighteen address bits of information are required to decode each of the 262,144 storage cell locations in each of the arrays 10a-10d. Nine row address bits are input on pins A0 through A8 and are latched with the signal $\overline{RAS}$. Then nine column address bits of information are set up on the pins A0 through A8 and are latched onto the device 10 as the first signal $\overline{CAS}$ falls. The signal $\overline{RAS}$ is similar to a chip enable signal in that it activates the sense amplifiers as well as the row decoders 11a and 11b. When a particular signal $\overline{CAS}$ goes to logic low, it acts as a chip select because this transition activates the corresponding output buffer 18.

The output enable signal, $\overline{G}$, controls the impedance of the output buffers. When the output enable signal $\overline{G}$ is high, the buffers 18 will remain in the high impedance state. Bringing the output enable signal $\overline{G}$ low during a normal cycle activates the output buffers 18, putting them in a low-impedance state. It is necessary for both the signal $\overline{RAS}$ and the signal $\overline{CAS}$ to be brought low in order for an associated output buffer to go into a low-impedance state. A buffer will remain in the low-impedance state until either the output enable signal $\overline{G}$ or the associated signal $\overline{CAS}$ is brought to a logic high level.

Read and Write operations are selected through the write-enable input when a write enable signal $\overline{W}$ is applied to pin 30. A logic high selects the read mode and a logic low signal selects the write mode. Data input is disabled when the read mode is selected. If the write enable signal $\overline{W}$ is in the logic low state prior to any of the input signals $\overline{CAS}$ transitioning to logic low, (early write), the output pins will remain in the high impedance state, permitting a write operation while the output enable signal $\overline{G}$ is low.

Data is written during a write or read-modify-write cycle. To initiate an early write cycle, the write enable signal $\overline{W}$ is brought low prior to a transition low by one or more of the signals $\overline{CAS}$. Data propagates to and from an addressed memory cell when the corresponding signal $\overline{CAS}$ transitions low. In a delayed write, or a read-modify-write cycle, signals $\overline{CAS}$ will already have transitioned to logic low states. Thus the data will be strobed in by the transition of the write enable signal $\overline{W}$ to logic low. In a delayed write or a read-modify-write cycle, the output enable signal $\overline{G}$ must be in a logic high state in order to bring the output sections of the buffers 18 to a high impedance state prior to impressing data on the I/O lines.

Figures 1, 1A:
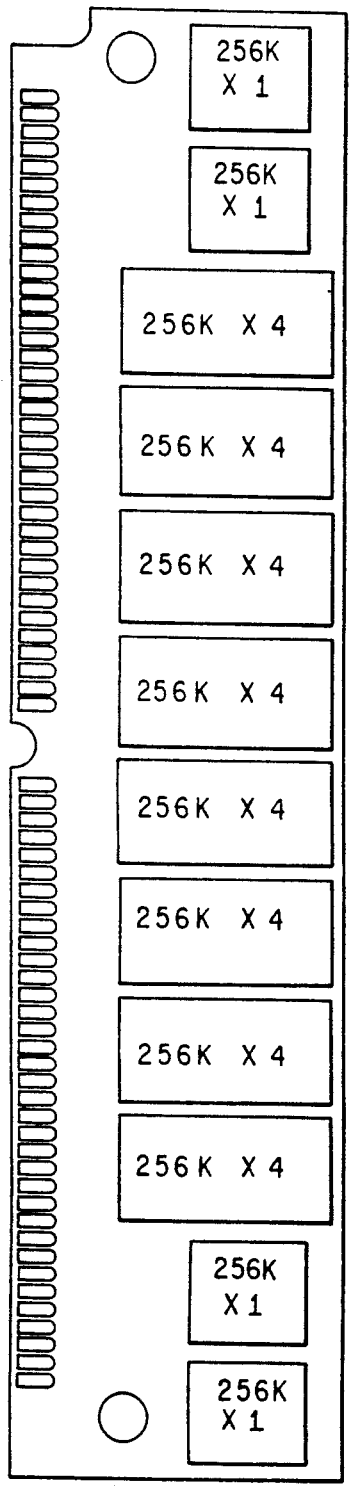
FIG. 1 illustrates a prior art memory module.
FIG. 1A is a legend table for FIG. 1.
Figure 10:
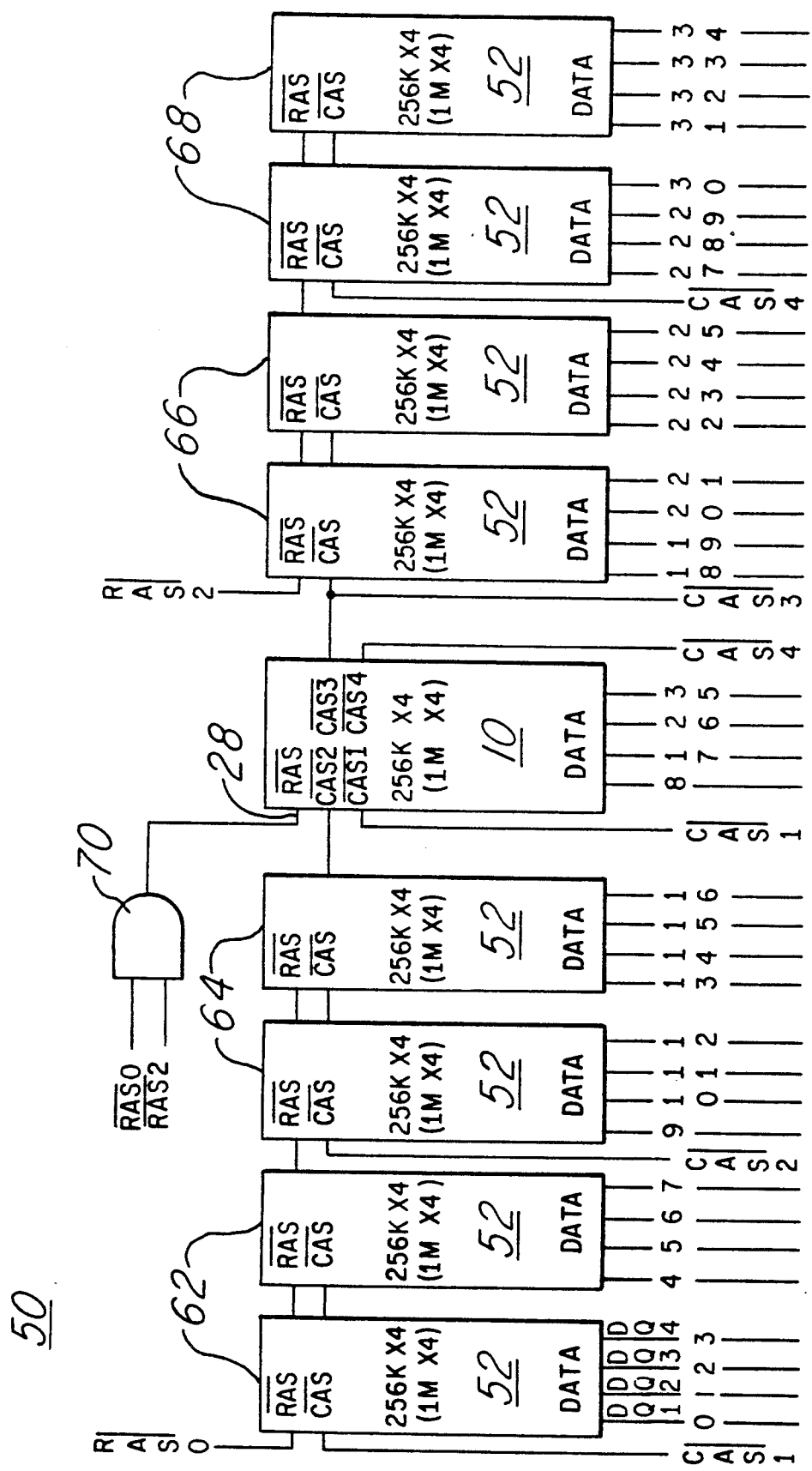
FIG. 10 is a schematic of a memory module which can be formed with the device of FIG. 2.

FIG. 10 illustrates a ×36 memory module 50 incorporating the device 10 and eight 256K×4 (1 Mbit) DRAM devices 52. The 256K×4 device 10 serves as a parity DRAM in lieu of four 256K×1 DRAM devices, such as illustrated in the prior art module of FIG. 1. A feature of the module 50 is that all of the devices 10 and 52 can be formed with a common technology, e.g., they are the same density and can be manufactured with the same technology. That is, because the devices 10 and 52 are of the same density, it is likely that they can be manufactured with the same generation technology. For example, the device 10 may be part TMS44C260 and the devices 52 may each be part TMS44C256, all available from Texas Instruments Incorporated, P.O. Box 1443, Houston, Tex. 77001. In contrast, prior art ×36 memory modules of the same capacity were formed with four 256K×1 DRAM devices as illustrated in FIG. 1. From the viewpoints of cost, performance and device availability, it is advantageous to form the module 50 with same generation parts.

Each of the devices 52 has one Row Address Strobe input pin, one Column Address Strobe input pin and four data pins, DQ1, DQ2, DQ3 and DQ4. To effect transfer of eight-bit words, the devices 52 are grouped in pairs 62, 64, 66 and 68 with the Column Address Strobe input pins of each pair wired in common. In addition, each of the four Column Address Strobe pins 29a-29d of the device 10 is wired in common with the commonly wired Column Address Strobe pins of one of the pairs. In this exemplary module 50, the Row Address Strobe pins for two pairs of devices 62 and 64 are wired in common to receive signal $\overline{RAS0}$ and the Row Address Strobe pins of the remaining two pairs of devices 66 and 68 are wired in common to receive the signal $\overline{RAS2}$. In addition, the signals $\overline{RAS0}$ and $\overline{RAS2}$ are input to a NAND gate 70, the output of which is provided to the Row Address Strobe pin 28 of the device 10.

This architecture enables data I/O from the device 10 when device pairs 62 and 64 are accessed and/or enables data I/O from the device 10 when device pairs 66 and 68 are accessed. Thus the device 10 is accessed with an appropriate signal $\overline{RAS0}$ or $\overline{RAS2}$ in order to transfer a ninth data bit for each eight-bit word being transferred to or from the devices 52.

Another advantage of forming all of the module components with devices that are manufactured with the same technology is that the features of the most advanced design can be made common to all of the module devices. For example, the 256K×1 devices of FIG. 1 may be NMOS while the associated 256K×4 devices are CMOS. In addition to including four Column Address Strobe inputs, the device 10 can include special features common to devices 52 of the same generation which have single Column Address Strobe inputs. These may include nibble mode, static column mode or serial mode.

Figure 11:
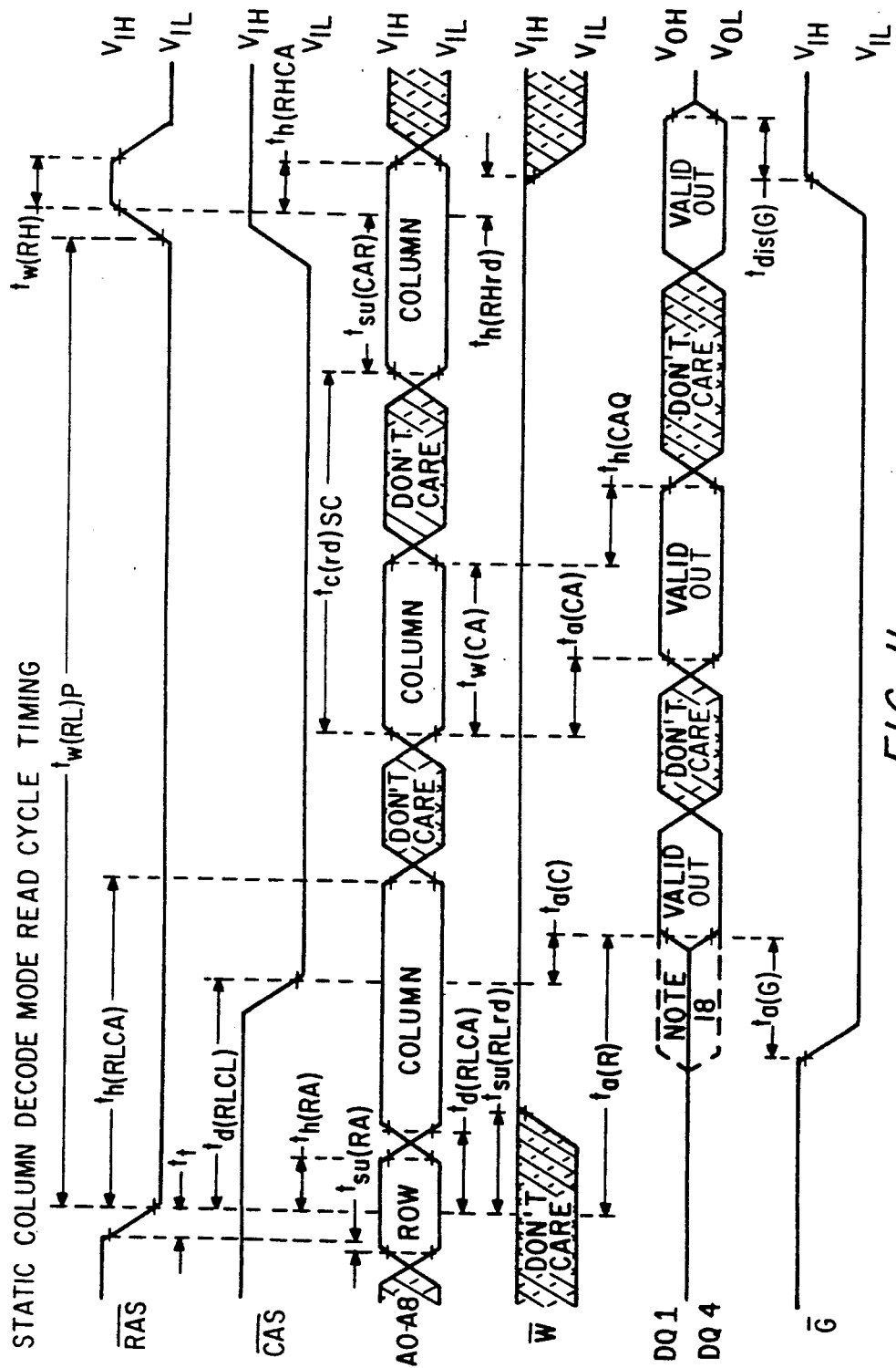
FIG. 11 is a timing diagram illustrating static column mode operation. Identical reference numerals and nomenclature are employed in the various figures unless otherwise noted.

With this improvement, the module can be used to provide one or more special features which in the past could not be implemented because not all of the devices included that feature. For example, all of the devices 10 and 52 could function in the static column mode wherein the signal $\overline{CAS}$ is held in a logic low state and the address signals are statically strobed, as shown in the timing diagram of FIG. 11. Static column mode operation is also discussed in the Data Sheet for part TMS44C257 (256K×4 DRAM), published by Texas Instruments and incorporated herein by reference.

Although a 1 Mbit DRAM having four Column Address Strobe inputs has been illustrated, other embodiments of the invention will be apparent to those skilled in the art. Volatile and nonvolatile memory devices may be constructed with multiple Column Address Strobe input pins to individually control data paths. While it is contemplated that integer multiples of four Column Address Strobe inputs will be most useful to the specific applications discussed herein, the invention is not so limited. Nor is it limited to applications where the data, stored in a module device having multiple Column Address Strobe inputs, is parity data. Of course, when parity data is stored in a module according to the invention, the parity data need not be stored in the particular device that has multiple Column Address Strobe input pins. Rather, a feature of the invention is the provision of a device architecture, which when applied to a memory module, results in a convenient and cost effective means for storing strings of data having lengths which are integer multiples of nine bits.

Larger devices, e.g., 256K×8, 1M×4, 1M×8, 16M×8, etc., having multiple Column Address Strobe input pins can be used to form memory modules according to the invention. A module can be formed with a 256K×4 device like that of the device 10 in conjunction with eight 1 Mbit×4 devices like the devices 52. Memory modules, formed with multiple Column Address Strobe input devices, can be configured to provide 32 bit, 64 bit or wider data I/O. Such modules can also be configured to provide smaller word sizes. To reduce access times, the devices may be configured into data blocks which can be individually accessed by interleaving the signals $\overline{RAS0}$ and $\overline{RAS2}$.

Although certain preferred embodiments of the invention have been described, it should be appreciated that numerous other modifications can be made without departing from the scope of the invention, which is limited only by the following claims.

We claim:

1. A memory module comprising:

first, second, third and fourth discrete memory devices, each memory device including four equal storage capacity arrays of dynamic memory cells, each array having a row address strobe terminal and a column address strobe terminal and being connected with a different separate data lead for random access writing and reading;

a lead for applying a row address strobe signal to the row address strobe terminals of the first, second third and fourth discrete memory devices;

a lead for applying a first column address strobe signal to the column address strobe terminals of the first and second discrete memory devices;

a lead for applying a second column address strobe signal to the column address strobe terminals of the third and fourth discrete memory devices;

a fifth discrete memory device including at least first and second dynamic cell arrays, each of the first and second dynamic cell arrays having the equal storage capacity, a row address strobe terminal receiving the row address strobe signal, and a different separate data lead;

the first dynamic cell array including a column address strobe terminal for receiving the first column address strobe signal; and the second dynamic cell array including a column address strobe terminal for receiving the second column address strobe signal.

2. A memory module comprising:

first, second, third, fourth, fifth, sixth, seventh and eighth discrete memory devices, each device including four equal storage capacity arrays of dynamic memory cells, each array having a row address strobe terminal and a column address strobe terminal and being connected with its own separate data lead for random access writing and reading, and a lead for applying a first row address strobe signal to the row address strobe terminals of the first, second, third and fourth discrete memory devices;

a lead for applying a second row address strobe signal to the row address strobe terminals of the fifth, sixth, seventh and eighth discrete memory devices;

a lead for applying a first column address strobe signal to the column address strobe terminals of the first and second discrete memory devices;

a lead for applying a second column address strobe signal to the column address strobe terminals of the third and fourth discrete memory devices;

a lead for applying a third column address strobe signal to the column address strobe terminals of the fifth and sixth discrete memory devices;

a lead for applying a fourth column address strobe signal to the column address strobe terminals of the seventh and eighth discrete memory devices;

a ninth discrete memory device including first, second, third and fourth dynamic memory cell arrays, each array having:

the equal storage capacity, a row address strobe terminal for receiving a logical AND of the first and second row address strobe signals, its own separate data lead; and the first dynamic memory cell array including a column address strobe terminal for receiving the first column address strobe signal;

the second dynamic memory cell array including a column address strobe terminal for receiving the second column address strobe signal;

the third dynamic memory cell array including a column address strobe terminal for receiving the third column address strobe signal; and the fourth dynamic memory cell array including a column address strobe terminal for receiving the fourth column address strobe signal.

* * * * *

REEXAMINATION CERTIFICATE (3678th)

United States Patent [19]

[11] B1 5,228,132

Neal et al.

[45] Certificate Issued  Dec. 1, 1998

[54] MEMORY MODULE ARRANGED FOR DATA AND PARITY BITS

[75] Inventors: Joseph H. Neal, Missouri City; Kenneth A. Poteet, Houston, both of Tex.

[73] Assignee: Texas Instruments Incorporated, Dallas, Tex.

Reexamination Request:
No. 90/004,358, Sep. 6, 1996

Reexamination Certificate for:
Patent No.: 5,228,132
Issued: Jul. 13, 1993
Appl. No.: 800,773
Filed: Nov. 27, 1991

Related U.S. Application Data

[63] Continuation of Ser. No. 415,074, Sep. 29, 1989, Pat. No. 5,089,993.

[51] Int. Cl.$^6$ .......................... G06F 13/00; G06F 11/10; G06F 1/04; G11C 7/00
[52] U.S. Cl. .......................... 711/5; 365/63; 365/72; 365/193; 365/230.03; 365/233; 365/238.5; 371/49.1
[58] Field of Search ........................ 395/405, 431, 395/432; 365/52, 63, 193, 230.03, 238.5, 233; 371/49.1, 50.1, 51.1; 711/5, 104, 105

[56] References Cited

U.S. PATENT DOCUMENTS

4,636,986  1/1987  Pinkham ............... 365/230.03

OTHER PUBLICATIONS

Micron Technology, Inc., MOS Data Book, pp. 1–165 to 1–190 (1991).

Micron Technology, *JEDEC Write–Per–Bit DRAM Module Proposal*, Sep. 6, 1988.

"Minutes of Meeting", JEDEC, Apr. 30, 1987, IBM SIP/SIM Proposal.

"IBM Physical Memory Reference Manual" Chapter 7–Memory, pp. 272–288 (date unknown).

"IBM Personal System/2™ 2–8MB 80386 Memory Expansion Option Installation Instructions", 1988.

*Primary Examiner*—Glenn A. Gossage

[57] ABSTRACT

A semiconductor memory architecture, which includes a given number of discrete components, provides a memory module of increased capacity. The memory module includes a plurality of discrete data memory circuits each organized to provide an individual data string having a length that is an integer multiple of four bits. Each memory circuit has a different separate data lead. A row address strobe signal is applied to the memory circuits. A different column address strobe signal is applied to pairs of the memory circuits. Another discrete memory device includes plural dynamic cell arrays, each of the dynamic cell arrays having a terminal for receiving a row address strobe and a different separate data lead. Each of the dynamic cell arrays has a terminal for receiving a different column address strobe signal.

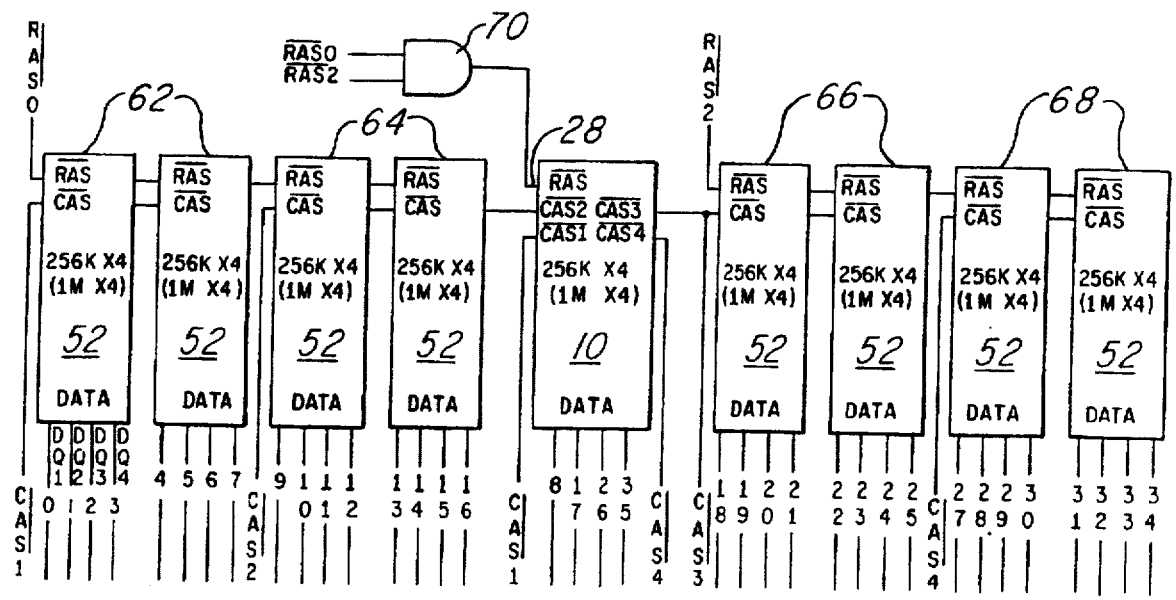

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 2 are determined to be patentable as amended.

1. A memory module comprising:
   first, second, third and fourth discrete memory devices, each memory device including four equal storage capacity arrays of dynamic memory cells, each array having a row address strobe terminal and a column address strobe terminal and being connected with a different separate lead for random access writing and reading;
   a lead for applying a row address strobe signal to the row address strobe terminals of the first, second third and fourth discrete memory devices;
   a lead for applying a first column address strobe signal to the column address strobe terminals of the first and second discrete memory devices;
   a lead for applying a second column address strobe signal to the column address strobe terminals of the third and fourth discrete memory devices;
   a fifth discrete memory device including at least first and second dynamic cell arrays, each of the first and second dynamic cell arrays having the equal storage capacity, a row address strobe terminal receiving the row address strobe signal, and [a] different separate *first and second* data [lead] *leads*;
   the first dynamic cell array including a column address strobe terminal for receiving the first column address strobe signal, *the first dynamic cell array producing a datum on the first data lead in response to the first column address strobe signal*; and
   the second dynamic cell array including a column address strobe terminal for receiving the second column address strobe signal, *the second dynamic cell array producing a datum on the second data lead in response to the second column address strobe signal.*

2. A memory module comprising:
   first, second, third, fourth, fifth, sixth, seventh and eighth discrete memory devices, each memory device including four equal storage capacity arrays of dynamic memory cells, each array having a row address strobe terminal and a column address strobe terminal and being connected with its own separate lead for random access writing and reading, and
   a lead for applying a first row address strobe signal to the row address strobe terminals of the first, second third and fourth discrete memory devices;
   a lead for applying a second row address strobe signal to the row address strobe terminals of the fifth, sixth, seventh and eighth discrete memory devices;
   a lead for applying a first column address strobe signal to the column address strobe terminals of the first and second discrete memory devices;
   a lead for applying a second column address strobe signal to the column address strobe terminals of the third and fourth discrete memory devices;
   a lead for applying a third column address strobe signal to the column address strobe terminals of the fifth and sixth discrete memory devices;
   a lead for applying a fourth column address strobe signal to the column address strobe terminals of the seventh and eighth discrete memory devices;
   a ninth discrete memory device including a first, second, third and fourth dynamic memory cell arrays, each array having:
   the equal storage capacity,
   a row address strobe terminal for receiving a logical AND of the first and second row address strobe signals,
   its own separate data lead; and
   the first dynamic memory cell array including a column address strobe terminal for receiving the first column address strobe signal, *the first dynamic cell array producing a datum on its own separate data lead in response to the first column address strobe signal*;
   the second dynamic memory cell array including a column address strobe terminal for receiving the second column address strobe signal, *the second dynamic cell array producing a datum on its own separate data lead in response to the second column address strobe signal*;
   the third dynamic memory cell array including a column address strobe terminal for receiving the third column address strobe signal, *the third dynamic cell array producing a datum on its own separate data lead in response to the third column address strobe signal*; and
   the fourth dynamic memory cell array including a column address strobe terminal for receiving the fourth column address strobe signal, *the fourth dynamic cell array producing a datum on its own separate data lead in response to the fourth column address strobe signal.*

\* \* \* \* \*